United States Patent [19]
Webb et al.

[11] Patent Number: 6,088,215
[45] Date of Patent: Jul. 11, 2000

[54] CAPACITOR AND METHOD OF MANUFACTURE

[75] Inventors: Brian A. Webb; Benjamin R. Davis, both of Chandler, Ariz.

[73] Assignee: Motorola, Inc., Schaumburg, Ill.

[21] Appl. No.: 08/963,492

[22] Filed: Nov. 3, 1997

[51] Int. Cl.[7] .............................. H01G 4/228; H01G 4/30
[52] U.S. Cl. .................................. 361/306.3; 361/306.7; 361/308.1; 361/311; 361/313
[58] Field of Search .............................. 361/301.4, 306.1, 361/308.3, 311, 312, 313, 310, 309, 308.1, 307, 321.2, 321.5

[56] References Cited

U.S. PATENT DOCUMENTS

| | | | |
|---|---|---|---|
| 3,851,228 | 11/1974 | Sheard | 361/321.1 |
| 4,568,999 | 2/1986 | Larowe | 361/306.3 |
| 5,177,663 | 1/1993 | Ingleson et al. | 361/321 |
| 5,231,308 | 7/1993 | Fisch | 307/10.1 |
| 5,281,846 | 1/1994 | Kaiser | 257/528 |
| 5,480,834 | 1/1996 | Lake et al. | 438/614 |
| 5,652,693 | 7/1997 | Chou et al. | 361/306 |
| 5,654,221 | 8/1997 | Cronin et al. | 438/109 |
| 5,659,455 | 8/1997 | Herbert | 361/306 |
| 5,712,758 | 1/1998 | Amano et al. | 361/321.2 |
| 5,774,326 | 6/1998 | McConnelee et al. | 361/313 |
| 5,812,363 | 9/1998 | Kuroda et al. | 361/306.3 |

*Primary Examiner*—Kristine Kincaid
*Assistant Examiner*—Eric Thomas
*Attorney, Agent, or Firm*—Anthony M. Martinez

[57] ABSTRACT

A capacitor (30) compatible with wirebonding processes and a method for manufacturing the capacitor (30). The capacitor (30) includes a first plurality of conductive layers and a second plurality of conductive layers spaced apart by a plurality of dielectric layers. The first plurality of conductive layers is electrically connected to a peripheral contact (74) of the capacitor (30). The second plurality of conductive layers is electrically connected to an interior portion of the capacitor (30). The first plurality of conductive layers is interleaved with the second plurality of conductive layers.

19 Claims, 4 Drawing Sheets

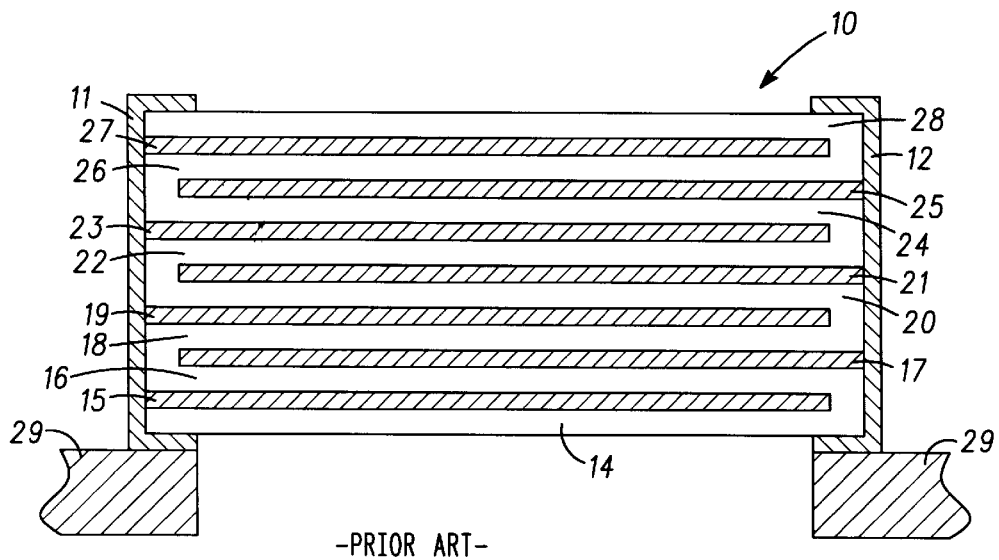
FIG. 1 —PRIOR ART—
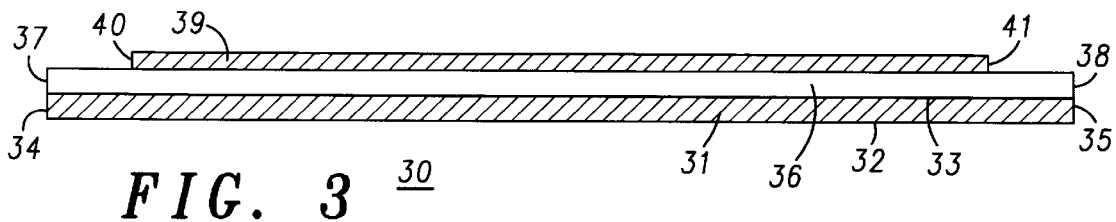
FIG. 3
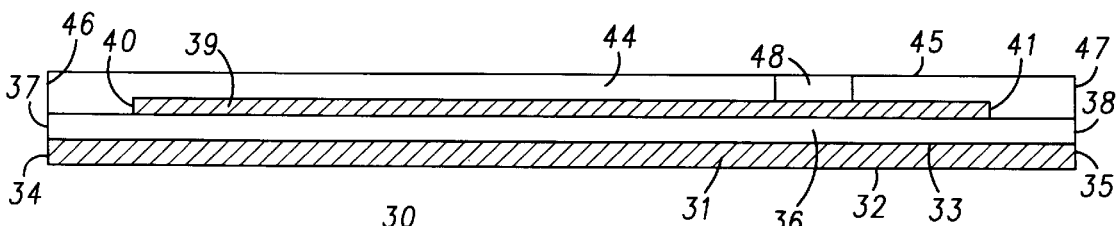
FIG. 4
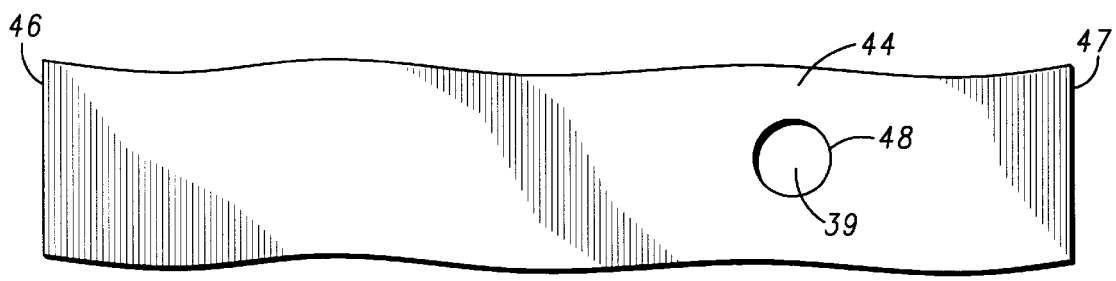
FIG. 5 ated or they have axial leads for mounting to printed circuit boards or other components. A disadvantage with these types of capacitors is that they are not compatible for use with wirebonding processes.

6,088,215

CAPACITOR AND METHOD OF MANUFACTURE

BACKGROUND OF THE INVENTION

The present invention relates, in general, to energy storage devices and, more particularly, to capacitors.

In electronic circuits, capacitors are used to process electrical signals, and as devices to store energy. Capacitors may be surface mounted to printed circuit boards to serve as bypass capacitors for filtering undesirable electrical signals. Typically, capacitors are either leadless for surface mounting to a printed circuit board or they have axial leads for mounting to printed circuit boards or other components. A disadvantage with these types of capacitors is that they are not compatible for use with wirebonding processes.

Accordingly, it would be advantageous to have a capacitor that can be used in wirebonding processes. It would be of further advantage for the capacitor to be compatible with standard semiconductor assembly processing techniques.

BRIEF DESCRIPTION OF THE DRAWINGS

FIG. 1 illustrates a cross-sectional view of a prior art capacitor;

FIG. 3 illustrates a cross-sectional view of a portion of the capacitor of FIG. 2 at a beginning stage of manufacture;

FIG. 4 is a cross-sectional view of the capacitor of FIG. 2 further along in manufacture;

FIG. 5 is a top view of the capacitor of FIG. 2 at the stage of manufacture shown in FIG. 4;

DETAILED DESCRIPTION OF THE DRAWINGS

Figure 2:
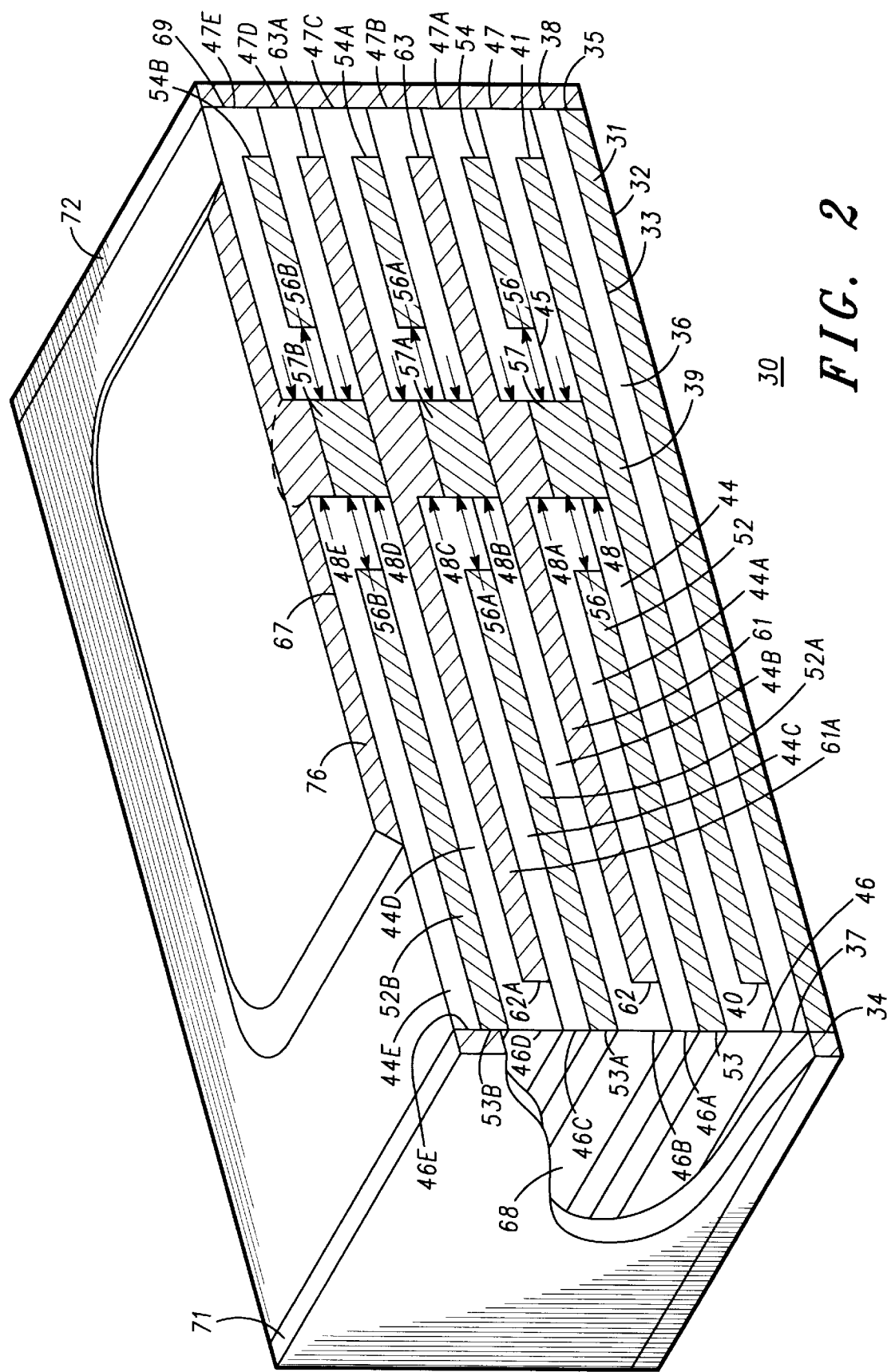
FIG. 2 is a partial isometric cross-sectional view of a portion of a capacitor in accordance with a first embodiment of the present invention.

Generally, the present invention provides an energy storage device and a method for manufacturing the energy storage device. In accordance with the present invention, the energy storage device is compatible with wirebonding processes.

FIG. 1 illustrates a cross-sectional view of a prior art capacitor 10. Capacitor 10 is a leadless capacitor commonly referred to as a chip capacitor. A capacitor is also known as an energy storage device. Capacitor 10 is comprised of two edge contacts 11 and 12 and a plurality of metal layers separated by a plurality of dielectric layers, wherein some of the metal layers are electrically connected to edge contact 11 and others are electrically connected to edge contact 12. More particularly, capacitor 10 includes a dielectric layer 14 having a metal layer 15 disposed thereon. Dielectric layer 14 extends from edge contact 11 to edge contact 12. Metal layer 15 extends from edge contact 11 towards edge contact 12 but is spaced apart from edge contact 12. A dielectric layer 16 is disposed on metal layer 15 and a metal layer 17 is disposed on a portion of dielectric layer 16. Dielectric layer 16 extends from edge contact 11 to edge contact 12. Metal layer 17 extends from edge contact 12 towards edge contact 11 but is spaced apart from edge contact 11.

A dielectric layer 18 is disposed on metal layer 17 and a metal layer 19 is disposed on a portion of dielectric layer 18. Dielectric layer 18 extends from edge contact 11 to edge contact 12. Metal layer 19 extends from edge contact 11 towards edge contact 12 but is spaced apart from edge contact 12.

A dielectric layer 20 is disposed on metal layer 19 and a metal layer 21 is disposed on a portion of dielectric layer 20. Dielectric layer 20 extends from edge contact 11 to edge contact 12. Metal layer 21 extends from edge contact 12 towards edge contact 11 but is spaced apart from edge contact 11.

A dielectric layer 22 is disposed on metal layer 21 and a metal layer 23 is disposed on a portion of dielectric layer 22. Dielectric layer 22 extends from edge contact 11 to edge contact 12. Metal layer 23 extends from edge contact 11 towards edge contact 12 but is spaced apart from edge contact 12.

A dielectric layer 24 is disposed on metal layer 23 and a metal layer 25 is disposed on a portion of dielectric layer 24. Dielectric layer 24 extends from edge contact 11 to edge contact 12. Metal layer 25 extends from edge contact 12 towards edge contact 11 but is spaced apart from edge contact 11.

A dielectric layer 26 is disposed on metal layer 25 and a metal layer 27 is disposed on a portion of dielectric layer 26. Dielectric layer 26 extends from edge contact 11 to edge contact 12. Metal layer 27 extends from edge contact 11 towards edge contact 12 but is spaced apart from edge contact 12.

A dielectric layer 28 is disposed on metal layer 27 and extends from edge contact 11 to edge contact 12. Therefore, layers 15, 19, 23, and 27 are electrically connected to edge contact 11 and layers 17, 21, and 25 are electrically connected to edge contact 12. Metal layers 15, 19, 23, and 27 form an interleaving structure with metal layers 17, 21, and 25. Metal layers 15, 19, 23, and 27 are electrically isolated from metal layers 17, 21, and 25. Prior art capacitor 10 is electrically connected to a leadframe 29 via edge contacts 11 and 12. Techniques for manufacturing capacitors such as capacitor 10 are well known to those skilled in the art.

FIG. 2 is a partial isometric cross-sectional view of a portion of a capacitor 30 in accordance with a first embodiment of the present invention. Capacitor 30 is comprised of a plurality of layers of an electrically conductive material alternating or interleaved and separated by a plurality of layers of a dielectric material. The plurality of layers of electrically conductive material and the plurality of layers of dielectric material are further described with reference to FIGS. 3–10.

Now referring to FIG. 3, a cross-sectional view of a portion of capacitor 30 at a beginning stage of manufacture is illustrated. What is shown in FIG. 3 is a layer 31 of electrically conductive material such as, for example, copper, having a bottom surface 32, a top surface 33, and edges 34 and 35. A layer 36 of dielectric material such as, for example, ceramic, having edges 37 and 38 is disposed or formed on top surface 33. Suitable materials for the plurality of layers of electrically conductive material include copper, nickel, gold, molybdenum-magnesium, or combinations thereof, or the like. Suitable materials for the plurality of layers of dielectric material include ceramic, polyemid, or the like. Preferably, edge 37 is aligned to and contiguous with edge 34 and edge 38 is aligned to and contiguous with edge 35. A layer 39 of electrically conductive material is disposed on a portion of dielectric layer 36. Conductive layer 39 has edges 40 and 41 that are not spaced as far apart as edges 37 and 38. In other words, the distance between edges 40 and 41 is less than the distance between edges 37 and 38. The top and bottom surfaces of a layer are also referred to as major surfaces and edges are also referred to as minor surfaces.

FIG. 4 is a cross-sectional view of capacitor 30 further along in manufacture. It should be understood that the same reference numerals are used in the figures to denote the same elements. A layer 44 of dielectric material having a top surface 45, edges 46 and 47, and an opening 48 is formed on conductive layer 39. In addition to covering conductive layer 39, dielectric layer 44 covers the portions of dielectric layer 36 that are not covered by conductive layer 39, i.e., dielectric layer 44 covers the exposed or uncovered portions of dielectric layer 36 adjacent to edges 40 and 41. Preferably, edge 46 is aligned to and contiguous with edges 37 and 34 and edge 47 is aligned to and contiguous with edges 38 and 35. Openings in dielectric layers are formed by methods such as, for example, punching, stamping, drilling, or the like.

Briefly referring to FIG. 5, a top view of capacitor 30 at the stage of manufacture shown in FIG. 4 is illustrated. More particularly, FIG. 5 is a top view of dielectric layer 44 and illustrates opening 48 and edges 46 and 47. A portion of conductive layer 39 is exposed by opening 48.

Figure 6:
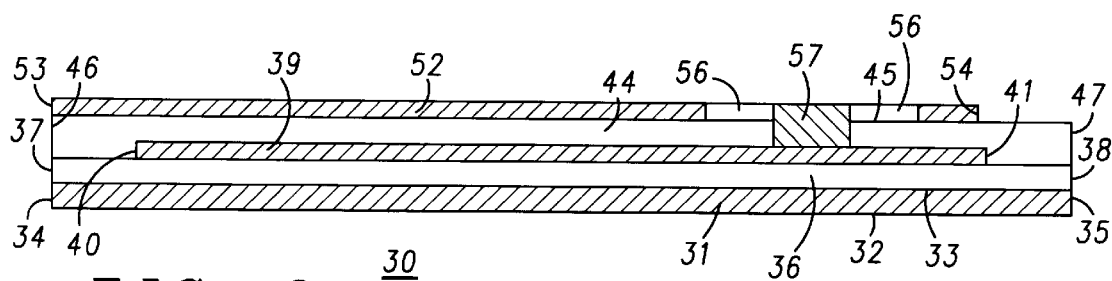
FIG. 6 is a cross-sectional view of the capacitor of FIG. 2 further along in manufacture.

FIG. 6 is a cross-sectional view of capacitor 30 further along in manufacture. An electrically conductive material is disposed on a portion of dielectric layer 44 to form a conductive layer 52 having edges 53 and 54 and an opening 56. In addition, the electrically conductive material is disposed within opening 48 and within opening 56 to form a filled via 57. Preferably, the diameter of opening 56 is larger than the diameter of opening 48, opening 56 is centered about opening 48, edge 54 is aligned to edge 41, and edge 53 is aligned to edge 46. Filled via 57 electrically contacts conductive layer 39 and is electrically isolated from conductive layer 52. Filled via 57 can also be referred to as a contact. Conductive layers are formed on dielectric layers by standard processing techniques such as, for example, silk screening, screen printing, or the like. In addition, these techniques are used to form a filled via, such as, filled via 57 and isolate filled via 57 from conductive layer 52.

Figure 7:
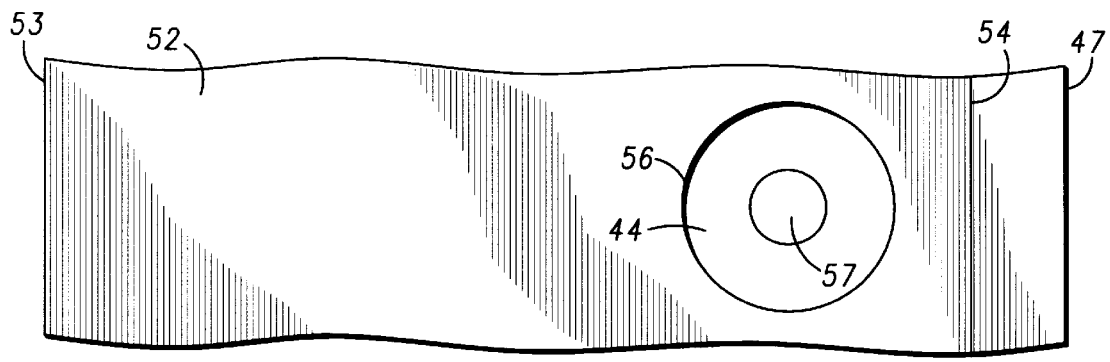
FIG. 7 is a top view of the capacitor of FIG. 2 at the stage of manufacture shown in FIG. 6.

Briefly referring to FIG. 7, a top view of capacitor 30 at the stage of manufacture shown in FIG. 6 is illustrated. More particularly, FIG. 7 is a top view of conductive layer 52 and illustrates opening 56, edges 53 and 54 of conductive layer 52, and edge 47 of dielectric layer 44. A portion of dielectric layer 44 is exposed through opening 56. In addition, filled via 57 is exposed by opening 56.

Figure 8:
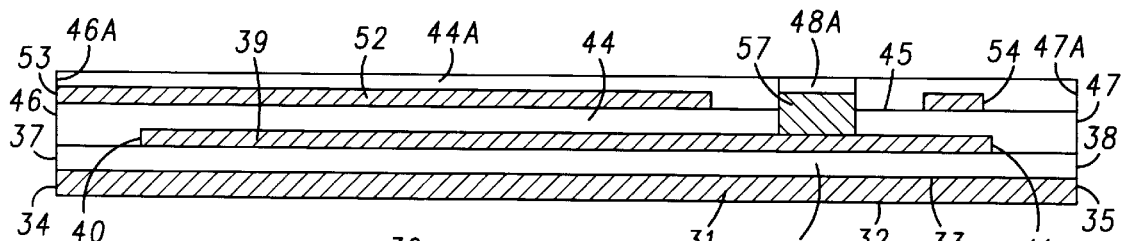
FIG. 8 is a cross-sectional view of the capacitor of FIG. 2 further along in manufacture.

FIG. 8 is a cross-sectional view of capacitor 30 further along in manufacture. A layer 44A of dielectric material having edges 46A and 47A and an opening 48A is formed on conductive layer 52. Preferably, the diameter of opening 48A is substantially equal to the diameter of opening 48, opening 48A is centered on opening 48, edge 46A is aligned to edge 46, and edge 47A is aligned to edge 47. In addition to covering conductive layer 52, dielectric layer 44A covers the portions of dielectric layer 44 that are not covered by conductive layer 52, i.e., dielectric layer 44A fills opening 56 and the exposed or uncovered portions of dielectric layer 44 adjacent edge 54.

Figure 9:
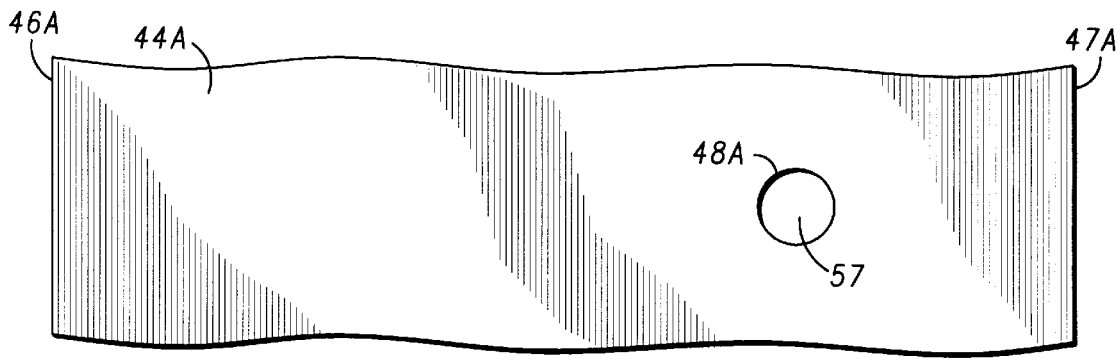
FIG. 9 is a top view of the capacitor of FIG. 2 at the stage of manufacture shown in FIG. 8.

Briefly referring to FIG. 9, a top view of capacitor 30 at the stage of manufacture shown in FIG. 8 is illustrated. More particularly, FIG. 9 is a top view of dielectric layer 44A and illustrates opening 48A and edges 46A and 47A. Filled via 57 is exposed by opening 48A.

Figure 10:
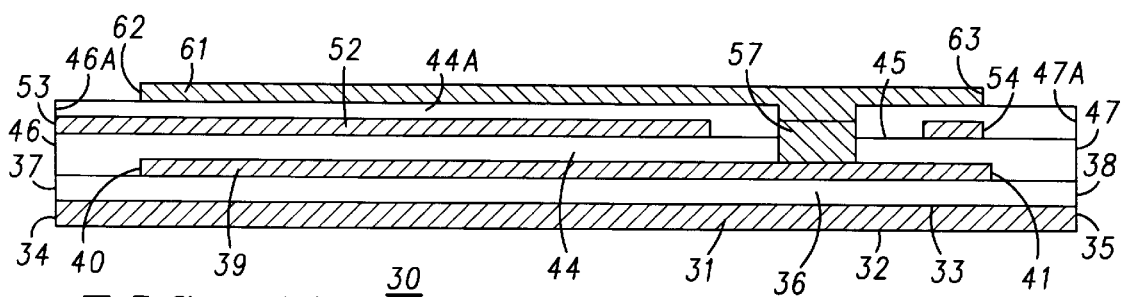
FIG. 10 is a cross-sectional view of the capacitor of FIG. 2 further along in manufacture.

FIG. 10 is a cross-sectional view of capacitor 30 further along in manufacture. A layer 61 of conductive material having edges 62 and 63 is disposed on a portion of dielectric layer 44A and within opening 48A. Conductive layer 61 electrically contacts filled via 57. Preferably, edge 62 is aligned to edge 40 and edge 63 is aligned to edges 41 and 54.

The manufacture of the remainder of the conductive layers and dielectric layers is described with reference to FIG. 2. A layer 44B of dielectric material having edges 46B and 47B and an opening 48B is formed on conductive layer 61. Preferably, the diameter of opening 48B is substantially equal to the diameter of opening 48, opening 48B is aligned to opening 48, edge 46B is aligned to edge 46, and edge 47B is aligned to edge 47. In addition to covering conductive layer 61, dielectric layer 44B covers the portions of dielectric layer 44A that are not covered by conductive layer 61, i.e., dielectric layer 44B covers the exposed or uncovered portions of dielectric layer 44A adjacent to edges 62 and 63.

An electrically conductive material is disposed on a portion of dielectric layer 44B to form a conductive layer 52A having edges 53A and 54A and an opening 56A. In addition, the electrically conductive material is disposed within opening 48B and within opening 56A to form a filled via 57A. Preferably, the diameter of opening 56A is substantially equal to the diameter of opening 56, opening 56A is centered about opening 48B, edge 54A is aligned to edge 54, and edge 53A is aligned to edge 53. Filled via 57A electrically contacts conductive layer 61 and is electrically isolated from conductive layer 52A.

A layer 44C of dielectric material having edges 46C and 47C and an opening 48C is formed on conductive layer 52A. Preferably, the diameter of opening 48C is substantially equal to the diameter of opening 48, opening 48C is aligned to opening 48, edge 46C is aligned to edge 46, and edge 47C is aligned to edge 47. In addition to covering conductive layer 52A, dielectric layer 44C covers the portions of dielectric layer 44B that are not covered by conductive layer 52A, i.e., dielectric layer 44C fills opening 56A and the exposed or uncovered portions of dielectric layer 44B adjacent edge 54A.

A layer 61A of conductive material having edges 62A and 63A is formed on a portion of dielectric layer 44C and within opening 48C. Preferably, edge 62A is aligned to edge 62 and edge 63A is aligned to edge 63.

A layer 44D of dielectric material having edges 46D and 47D and an opening 48D is formed on conductive layer 61A. Preferably, the diameter of opening 48D is substantially equal to the diameter of opening 48, opening 48D is aligned to opening 48, edge 46D is aligned to edge 46, and edge 47D is aligned to edge 47. In addition to covering conductive layer 61A, dielectric layer 44D covers the portions of dielectric layer 44C that are not covered by conductive layer 61A, i.e., dielectric layer 44D covers the exposed or uncovered portions of dielectric layer 44C adjacent to edges 62A and 63A.

An electrically conductive material is disposed on a portion of dielectric layer 44D to form a conductive layer 52B having edges 53B and 54B and an opening 56B. In addition, the electrically conductive material is disposed within opening 48D and within opening 56B to form a filled via 57B. Preferably, the diameter of opening 56B is substantially equal to the diameter of opening 56, opening 56B is centered about opening 48D, edge 54B is aligned to edge 54, and edge 53B is aligned to edge 53. Filled via 57B electrically contacts conductive layer 61A and is electrically isolated from conductive layer 52B.

A layer 44E of dielectric material having a top surface 67, edges 46E and 47E, and an opening 48E is formed on conductive layer 52B. Preferably, the diameter of opening 48E is substantially equal to the diameter of opening 48, opening 48E is aligned to opening 48, edge 46E is aligned to edge 46, and edge 47E is aligned to edge 47. In addition to covering conductive layer 52B, dielectric layer 44E covers the portions of dielectric layer 44D that are not covered by conductive layer 52B, i.e., dielectric layer 44E fills opening 56B and the exposed or uncovered portions of dielectric layer 44D adjacent edge 54B.

Preferably, conductive layers 31, 39, 52, 52A, 52B, 61, and 61A have a thickness ranging between approximately 10 micrometers ($\mu$m) and approximately 50 $\mu$m. In addition, it is preferable that dielectric layers 36, 44, 44A, 44B, 44C, 44D, and 44E have a thickness ranging between approximately 5 $\mu$m and approximately 100 $\mu$m. The diameters of openings 48, 48A, 48B, 48C, 48D, and 48E range between approximately 10 $\mu$m and approximately 200 $\mu$m. The diameters of openings 56, 56A, and 56B range between approximately 50 $\mu$m and approximately 300 $\mu$m. By way of example, the plurality of dielectric layers of capacitor 30 have a thickness greater than the thickness of the plurality of conductive layers.

Edges 34, 37, 46, 53, 46A, 46B, 53A, 46C, 46D, 53B and 47E cooperate to form an edge surface 68. Edges 35, 38, 47, 47A, 47B, 47C, 47D, and 47E cooperate to form an edge surface 69. Conductive layers 39, 61, and 61A are electrically coupled to each other by filled vias 57, 57A, and 57B.

A layer of conductive material is disposed on a portion of top surface 67 and on filled via 57B to form a top contact 76. Top contact 76 electrically contacts filled via 57B and, therefore, is electrically coupled to conductive layers 39, 61, and 61A. Top contact 76 is sometimes referred to as a wirebond pad. Further, a layer 71 of conductive material is disposed on edge surface 68 and a layer 72 of conductive material is disposed on edge surface 69. Conductive layers 31, 52, 52A, and 52B are electrically coupled together by layer 71. Conductive layers 31, 71, and 72 cooperate to form edge contact 74. It should be noted that edge contact 74 can be formed without conductive layers 31 and 72. Suitable materials for top contact 76 and edge contact 74 include copper, nickel, gold, molybdenum-magnesium, or combinations thereof, or the like.

Figure 11:
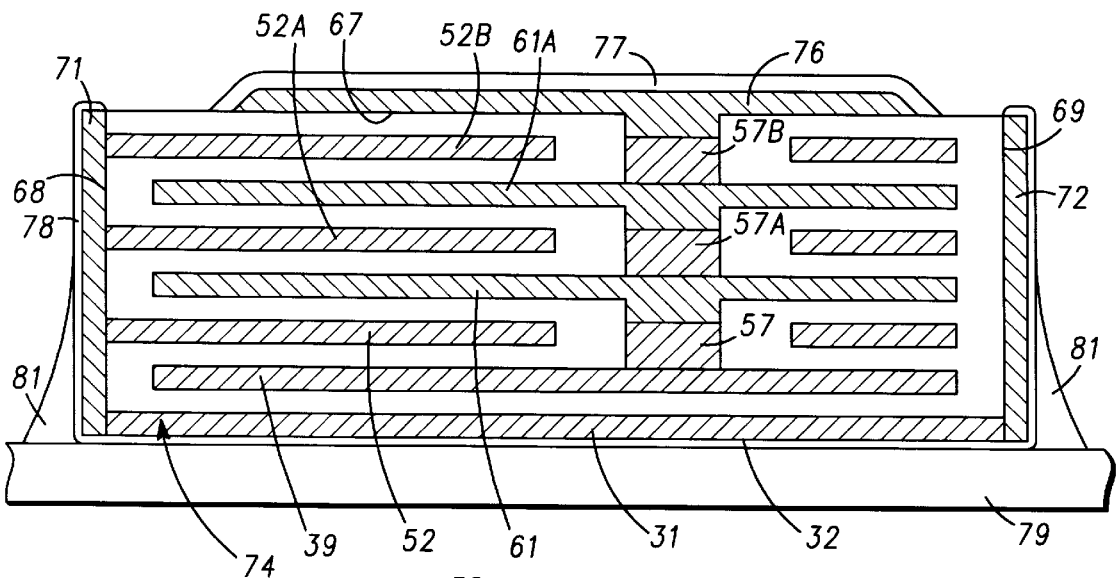
FIG. 11 is a cross-sectional view of the capacitor of FIG. 2 attached to a substrate.

FIG. 11 is a cross-sectional view of capacitor 30 attached to a substrate 79. Substrate 79 can be a leadframe, a ceramic substrate, a flexible circuit, a glass substrate, a printed circuit board, a conductive circuit, or the like. By way of example, capacitor 30 is attached to a leadframe 79 using an electrically conductive epoxy 81.

Preferably, a wirebond material 77 compatible with wirebonding is disposed on top contact 76 and a solder material 78 compatible with soldering is disposed on edge contact 74. Suitable materials for wirebond material 77 include gold, palladium, palladium-nickel alloy, or the like. Suitable materials for solder material 78 include tin-lead alloy, gold, palladium, palladium-nickel alloy, or the like.

Capacitor 30 is heated until dielectric layers 36, 44, 44A, 44B, 44C, 44D, and 44E (FIG. 2) form together into a unitary dielectric material. As described hereinbefore, conductive layers 31, 39, 52, 61, 52A, 61A, and 52B are interleaved and separated by dielectric layers 36, 44, 44A, 44B, 44C, 44D, and 44E (FIG. 2). Similarly, conductive layers 31, 39, 52, 61, 52A, 61A, and 52B are interleaved and separated by the unitary dielectric material. Conductive layers 39, 61, and 61A remain electrically isolated from conductive layers 31, 52, 52A, and 52B by the unitary dielectric material. It should be noted that edge surfaces 68 and 69 can be referred to as peripheral portions of capacitor 30 and the area between edge surfaces 68 and 69 can be referred to as an interior portion of capacitor 30.

Although capacitor 30 is shown as having seven conductive layers interleaved and spaced apart by seven dielectric layers, this is not a limitation of the present invention. Capacitor 30 can have two or more conductive layers interleaved and spaced apart by two or more dielectric layers. Increasing the number of interleaved conductive layers and dielectric layers results in a higher capacitance value for capacitor 30.

An advantage of capacitor 30 over prior art capacitor 10 is that capacitor 30 is compatible with die attach and wirebonding processes, whereas, prior art capacitor 10 is not compatible with die attach and wirebonding processes. Another advantage of capacitor 30 is that it may have only one contact attached to a leadframe. For example, edge contact 74 can be attached to a leadframe and top contact 76 can be connected by a wirebond to an electrical component. On the other hand, prior art capacitor 10 has at least two contacts attached to a leadframe which must be electrically isolated from the leadframe to eliminate exposure to external events such as, for example, Electrostatic Discharge (ESD) events or an electrical short across the two contacts of prior art capacitor 10.

Figure 12:
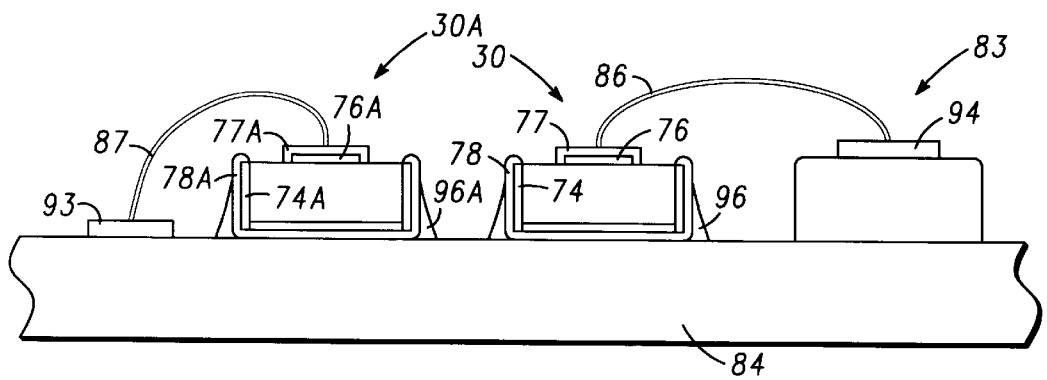
FIG. 12 is an electronic component in accordance with a second embodiment of the present invention.

FIG. 12 illustrates an electronic component 80 in accordance with a second embodiment of the present invention. Electronic component 80 is comprised of wirebond capacitors 30 and 30A, a semiconductor device 83, a substrate 84, and wirebonds 86 and 87. It should be understood that wirebond capacitors 30 and 30A are the same. However, the letter "A" has been appended to reference numbers associated with one of the wirebond capacitors to distinguish them from each other. Substrate 84 has a conductive pad 93. Wirebond capacitors 30 and 30A are coupled to substrate 84 via an electrically conductive epoxy 96. Semiconductor device 83 is connected to substrate 84. Wirebond pad 76 is coupled to a wirebond pad 94 of semiconductor device 83 via wirebond 86. Wirebond pad 76A is coupled to conductive pad 93 via wirebond 87.

By now it should be appreciated that a capacitor that can be manufactured using standard processing techniques has been provided. An advantage of the capacitor is that it is compatible with wirebonding processes.

What is claimed is:

1. A capacitor, comprising:
   a first plurality of electrically conductive layers extending from an exterior portion of the capacitor towards an interior portion of the capacitor;
   a second plurality of electrically conductive layers interleaved with the first plurality of electrically conductive layers and extending from the interior portion of the capacitor towards the exterior portion of the capacitor;
   a dielectric material separating the first and second plurality of electrically conductive layers;

an exterior contact formed on the exterior portion of the capacitor;

an interior contact formed in the interior portion of the capacitor, wherein the entire bottom portion of the interior contact is formed on a bottom most layer of the second plurality of electrically conductive layers; and a wirebond pad coupled to the interior contact and electrically isolated from the exterior contact.

2. The capacitor of claim 1, further comprising:

a wirebond material disposed on the wirebond pad; and a solder material disposed on the exterior contact.

3. The capacitor of claim 2, wherein the wirebond material is palladium and the solder material is tin-lead alloy.

4. The capacitor of claim 1, wherein the exterior contact and the interior contact comprise copper.

5. The capacitor of claim 1, wherein the wirebond pad is copper.

6. The capacitor of claim 1, wherein the first plurality of electrically conductive layers and the second plurality of electrically conductive layers comprise copper.

7. The capacitor of claim 1, wherein the dielectric material is ceramic.

8. An electronic component, comprising:

a wirebond capacitor having an edge contact and a wirebond pad;

a wirebond material disposed on the wirebond pad of the wirebond capacitor;

a solder material disposed on the edge contact of the wirebond capacitor;

a substrate, wherein the edge contact of the wirebond capacitor is coupled to the substrate;

a semiconductor device having a wirebond pad, wherein the semiconductor device is coupled to the substrate; and a wirebond that couples the wirebond pad of the wirebond capacitor to the wirebond pad of the semiconductor device.

9. The electronic component of claim 8, wherein the substrate is selected from the group consisting of a leadframe, a printed circuit board, a ceramic substrate, a flexible circuit, and a glass substrate.

10. An electronic component, comprising:

a wirebond capacitor having an edge contact and a wirebond pad;

a wirebond material disposed on the wirebond pad of the wirebond capacitor;

a solder material disposed on the edge contact of the wirebond capacitor;

a substrate having a conductive pad, wherein the edge contact of the wirebond capacitor is coupled to the substrate; and a wirebond that couples the wirebond pad of the wirebond capacitor to the conductive pad of the substrate.

11. The electronic component of claim 10, wherein the wirebond capacitor comprises:

an interior contact electrically contacting the wirebond pad of the wirebond capacitor;

a first plurality of electrically conductive layers extending from the edge contact of the wirebond capacitor towards the interior contact;

a second plurality of electrically conductive layers extending from the interior contact towards the edge contact of the wirebond capacitor, wherein the second plurality of electrically conductive layers is interleaved with the first plurality of electrically conductive layers; and a dielectric material, wherein the first plurality of electrically conductive layers is separated from the second plurality of electrically conductive layers by the dielectric material.

12. The electronic component of claim 11, wherein the edge contact of the wirebond capacitor electrically contacts the first plurality of electrically conductive layers and the interior contact electrically contacts the second plurality of electrically conductive layers.

13. A capacitor, comprising:

a first plurality of electrically conductive layers connected to an exterior contact formed on an external surface of the capacitor;

a second plurality of electrically conductive layers interleaved with the first plurality of electrically conductive layers and connected to an interior contact formed in an interior portion of the capacitor, wherein the interior contact is formed on a bottom most layer of the second plurality of electrically conductive layers;

a wirebond pad connected to the interior contact;

a wirebond material disposed on the wirebond pad; and a solder material disposed on the exterior contact.

14. The capacitor of claim 13, further comprising a dielectric material separating the first and second plurality of electrically conductive layers.

15. An electronic assembly, comprising:

a wirebond capacitor having an edge contact, a plurality of internal electrodes, and a wire bond pad; and a printed circuit board, wherein the edge contact of the wirebond capacitor is coupled to the printed circuit board, said plurality of internal electrodes substantially parallel with said printed circuit board.

16. The electronic assembly of claim 15, further comprising:

a semiconductor device having a wirebond pad, wherein the semiconductor device is coupled to the printed circuit board; and a wirebond that couples the wirebond pad of the wirebond capacitor to the wirebond pad of the semiconductor device.

17. The electronic assembly of claim 15, further comprising:

a wirebond material disposed on the wirebond pad of the wirebond capacitor; and a solder material disposed on the edge contact of the wirebond capacitor.

18. The electronic assembly of claim 15, further comprising a wirebond that couples the wirebond pad of the wirebond capacitor to a conductive pad of the printed circuit board.

19. The electronic assembly of claim 15, further comprising a second wirebond capacitor having an edge contact and a wirebond pad, wherein the edge contact of the second wirebond capacitor is coupled to the printed circuit board.

* * * * *